(12) United States Patent
Tanaka et al.

(10) Patent No.: US 7,867,674 B2
(45) Date of Patent: Jan. 11, 2011

(54) SUBSTRATE-PROCESSING APPARATUS, SUBSTRATE-PROCESSING METHOD, SUBSTRATE-PROCESSING PROGRAM, AND COMPUTER-READABLE RECORDING MEDIUM RECORDED WITH SUCH PROGRAM

(75) Inventors: Michio Tanaka, Cupertino, CA (US); Shinichi Shinozuka, Kumamoto (JP); Masahide Tadokoro, Kumamoto (JP); Kunie Ogata, Kumamoto (JP); Hiroshi Tomita, Kumamoto (JP); Ryoichi Uemura, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 274 days.

(21) Appl. No.: 12/065,829

(22) PCT Filed: Sep. 13, 2006

(86) PCT No.: PCT/JP2006/318126
§ 371 (c)(1),
(2), (4) Date: Oct. 7, 2008

(87) PCT Pub. No.: WO2007/032369
PCT Pub. Date: Mar. 22, 2007

(65) Prior Publication Data
US 2009/0104548 A1    Apr. 23, 2009

(30) Foreign Application Priority Data
Sep. 13, 2005  (JP) .............................. 2005-265191
Jun. 29, 2006  (JP) .............................. 2006-179725

(51) Int. Cl.
G03C 5/00   (2006.01)
G03F 1/00   (2006.01)
H01L 21/00  (2006.01)

(52) U.S. Cl. .................. 430/30; 430/313; 430/330; 355/27; 355/30; 396/611

(58) Field of Classification Search ............ 430/30, 430/313, 330; 355/27, 30; 396/611
See application file for complete search history.

(56) References Cited

U.S. PATENT DOCUMENTS

| 6,402,509 | B1 * | 6/2002 | Ookura et al. .............. 432/253 |
| 6,644,965 | B2 * | 11/2003 | Ookura et al. .............. 432/253 |
| 6,984,477 | B2 * | 1/2006 | Ogata et al. .................. 430/22 |
| 7,488,127 | B2 * | 2/2009 | Ogata et al. ................. 396/611 |
| 7,510,341 | B2 * | 3/2009 | Hayasaki et al. ........... 396/611 |
| 2003/0008242 | A1 * | 1/2003 | Schedel et al. .............. 430/313 |

FOREIGN PATENT DOCUMENTS

| JP | 7 211630 | 8/1995 |
| JP | 2001 143850 | 5/2001 |
| JP | 2002 190446 | 7/2002 |
| JP | 2003 45767 | 2/2003 |
| JP | 2005 26362 | 1/2005 |

* cited by examiner

Primary Examiner—Christopher G Young
(74) Attorney, Agent, or Firm—Oblon, Spivak, McClelland, Maier & Neustadt, L.L.P.

(57) ABSTRACT

A pattern forming system 1 includes a checking apparatus 400 and a control section 500. The checking apparatus 400 is configured to measure and check a sidewall angle SWA of a resist pattern formed on a substrate W after a developing process. The control section 500 is configured to use a difference between a target value of the sidewall angle SWA of the resist pattern after the developing process and a check result of the sidewall angle SWA obtained by the checking apparatus 400, to set a process condition for a first heat process 71 to 74 or a second heat process 84 to 89 so as to cause the sidewall angle SWA to approximate the target value thereof after the developing process.

11 Claims, 8 Drawing Sheets

| Heating area (Wafer area corresponding thereto) / Offset | R1 (A1) | | | R2 (A2) | R3 (A3) | R4 (A4) | R5 (A5) |
|---|---|---|---|---|---|---|---|
| | Process temperature (°C) | Process time (sec) | Temperature increase/decrease value (°C) | | | | |
| ΔCD (μm) | ○○ | A | B | C | ---- | ---- | ---- | ---- |
| | □□ | D | E | F | ---- | ---- | ---- | ---- |
| | ---- | ---- | ---- | ---- | ---- | ---- | ---- | ---- |
| | △△ | G | H | I | ---- | ---- | ---- | ---- |
| | ●● | J | K | L | ---- | ---- | ---- | ---- |
| | ■■ | M | N | O | ---- | ---- | ---- | ---- |
| ΔSWA (degree) | ---- | ---- | ---- | ---- | ---- | ---- | ---- | ---- |
| | ▲▲ | P | Q | R | ---- | ---- | ---- | ---- |

FIG.9

SUBSTRATE-PROCESSING APPARATUS, SUBSTRATE-PROCESSING METHOD, SUBSTRATE-PROCESSING PROGRAM, AND COMPUTER-READABLE RECORDING MEDIUM RECORDED WITH SUCH PROGRAM

TECHNICAL FIELD

The present invention relates to a substrate processing system, substrate processing method, substrate processing program, and computer readable storage medium storing the program, for forming a predetermined pattern on a substrate by a photolithography technique.

BACKGROUND ART

In the sequence of photolithography for manufacturing semiconductor devices, the following processes are sequentially performed to form a predetermined resist pattern on a target substrate, such as a semiconductor wafer (which will be referred to as "wafer" hereinafter). Specifically, a resist coating process is performed such that a coating liquid or resist liquid is applied onto the wafer to form a resist film. Then, a pre-baking process (PAB) is performed such that a heat process is performed on the wafer treated by the coating process. Then, a light exposure process is performed such that the resist film is subjected to light exposure in accordance with a predetermined pattern. Then, a post-exposure-baking process (PEB) is performed such that a chemical reaction is promoted in the resist film treated by the light exposure. Then, a developing process is performed such that the resist film treated by the light exposure is developed.

Conventionally, a resist pattern dimension (which will be referred to as "resist profile"), such as the line width (CD) or sidewall angle (SWA) of a resist pattern, to be formed by the photolithography sequence described above is controlled by setting focal correction in the light exposure process.

The sidewall angle (SWA) means the inclination angle $\theta 1$ of a line sidewall, as shown by the sectional view of FIG. 11 that shows a line of a resist pattern.

The resist profile is also affected by a heat process in the photolithography sequence, so the process conditions set for a heat processing unit need to be exactly controlled. In order to exactly control the temperature on the surface of a wafer in heating, the heating plate of the heat processing unit is segmented into a plurality of areas, which are respectively provided with independent heaters built therein, so that the temperatures of the heating areas can be respectively adjusted.

In this respect, if the heating areas of the heating plate are controlled by use of the same set temperature, the temperature on the surface of a wafer on the heating plate may become less uniform, due to the difference in thermal resistance between the heating areas, for example. Where the temperature on the surface of the wafer is less uniform, a resist profile, such as the line width (CD) of a resist pattern, becomes also less uniform.

In light of this problem, conventionally, the heating areas of the heating plate are respectively provided with temperature correction values (offset values) for fine adjustment of the temperature on the surface of a wafer. The set temperatures of the heating areas of the heating plate are prepared by correcting the heat process temperature with the respective temperature correction values (for example, Jpn. Pat. Appln. KOKAI Publication No. 2001-143850).

As described above, conventionally, the uniformity in resist profile on the surface of a wafer processed by a photolithography sequence is controlled by temperature correction of the heating areas for a heat process, and formation of the resist profile is controlled by focal correction in the light exposure process.

However, with an advance in the miniaturization level of resist patterns in recent years, the focal correction in the light exposure process may be insufficient to fulfill control for forming a resist profile, such as the pattern line width (CD) or sidewall angle (SWA), with high precision.

Further, if the focal correction in the light exposure process is insufficient to fulfill high-precision control for forming a resist profile, the light exposure process is applied unevenly among areas of a wafer, so the resist profile on the surface of the wafer is less uniform.

DISCLOSURE OF INVENTION

The present invention was made under the circumstances, and has an object to provide a substrate processing system, substrate processing method, substrate processing program, and computer readable storage medium storing the program, which allow a desired resist pattern dimension to be attained after a photolithography sequence, so that a uniform resist pattern is formed on the surface of a substrate, independently of the precision level in the light exposure process.

According to the present invention, there is provided a substrate processing system for forming a predetermined resist pattern on a substrate by executing a series of processes, which comprises a coating process for applying a resist liquid onto the substrate, a first heat process for performing a heat process on the substrate after the coating process, a light exposure process for performing light exposure on a resist film in accordance with a predetermined pattern, a second heat process for promoting a chemical reaction in the resist film after the light exposure, and a developing process for developing the resist film after the light exposure, the system comprising: a checking apparatus configured to measure and check a sidewall angle of the resist pattern formed on the substrate after the developing process; and a control section configured to use a difference between a target value of the sidewall angle of the resist pattern after the developing process and a check result of the sidewall angle obtained by the checking apparatus, to set a process condition for the first heat process or the second heat process so as to cause the sidewall angle to approximate the target value thereof after the developing process.

The substrate processing system is preferably arranged such that the checking apparatus is configured to measure and check a line width of the resist pattern formed on the substrate after the developing process; and the control section is configured to use a difference between a target value of the line width of the resist pattern after the developing process and a check result of the line width obtained by the checking apparatus, to set a process condition for the second heat process or the first heat process so as to cause the line width to approximate the target value thereof after the developing process.

Process conditions for the first heat process or the second heat process preferably comprise at least a heat process temperature, a heat process time, and a temperature increase/decrease value.

With this arrangement, the line width and sidewall angle of a resist pattern, which are resist profiles, can be respectively corrected to attain target values for each of the first heat process and second heat process.

Consequently, desired values of the pattern line width and sidewall angle can be obtained on the substrate after the photolithography sequence.

Further, in order to obtain a desired resist profile, there is no need to use focal correction in the light exposure process. Accordingly, the resist profile can be controlled with high precision, independently of the precision level in the light exposure process.

The substrate processing system is preferably arranged such that the system comprises a first heat processing unit configured to perform the first heat process and a second heat processing unit configured to perform the second heat process, each of the first heat processing unit and the second heat processing unit includes a heating plate segmented into a plurality of heating areas and configured to place the substrate on the plurality of heating areas, and heating devices configured to respectively and independently heat the plurality of heating areas, and the checking apparatus is configured to measure and check the resist pattern after the developing process, for each of substrate areas of the substrate heat-processed respectively by the plurality of heating areas.

The control section is preferably configured to set a heat process condition for each of the plurality of heating areas of the heating plate.

With this arrangement, each of the line width and sidewall angle of a resist pattern can be uniform on the surface of the substrate after the photolithography sequence.

The control section is preferably configured to set a process condition for the first heat process or the second heat process for each process recipe determined by a combination of at least a heat process temperature and a resist liquid type.

With this arrangement, a suitable condition can be set for each process recipe to attain a desired resist profile even when a different process recipe is used.

According to the present invention, there is provided a substrate processing method for forming a predetermined resist pattern on a substrate by executing a series of processes, which comprises a coating process for applying a resist liquid onto the substrate, a first heat process for performing a heat process on the substrate after the coating process, a light exposure process for performing light exposure on a resist film in accordance with a predetermined pattern, a second heat process for promoting a chemical reaction in the resist film after the light exposure, and a developing process for developing the resist film after the light exposure, the method comprising: measuring and checking a sidewall angle of the resist pattern formed on the substrate after the developing process; and using a difference between a target value of the sidewall angle of the resist pattern after the developing process and a check result of the sidewall angle obtained by a checking apparatus, to set a process condition for the first heat process or the second heat process so as to cause the sidewall angle to approximate the target value thereof after the developing process in a subsequent series of processes.

The substrate processing method preferably comprises: measuring and checking a line width of the resist pattern formed on the substrate after the developing process; and using a difference between a target value of the line width of the resist pattern after the developing process and a check result of the line width obtained by the checking apparatus, to set a process condition for the second heat process or the first heat process so as to cause the line width to approximate the target value thereof after the developing process.

Process conditions for the first heat process or the second heat process preferably comprise at least a heat process temperature, a heat process time, and a temperature increase/decrease value.

With this arrangement, the line width and sidewall angle of a resist pattern, which are resist profiles, can be respectively corrected to attain target values for each of the first heat process and second heat process.

Consequently, desired values of the pattern line width and sidewall angle can be obtained on the substrate after the photolithography sequence.

Further, in order to obtain a desired resist profile, there is no need to use focal correction in the light exposure process. Accordingly, the resist profile can be controlled independently of the precision level in the light exposure process.

According to the present invention, there is provided a substrate processing program for execution on a computer, wherein the control program, when executed, causes the computer to control a substrate processing system to perform a substrate processing method for forming a predetermined resist pattern on a substrate by executing a series of processes, which comprises a coating process for applying a resist liquid onto the substrate, a first heat process for performing a heat process on the substrate after the coating process, a light exposure process for performing light exposure on a resist film in accordance with a predetermined pattern, a second heat process for promoting a chemical reaction in the resist film after the light exposure, and a developing process for developing the resist film after the light exposure, the method comprising: measuring and checking a sidewall angle of the resist pattern formed on the substrate after the developing process; and using a difference between a target value of the sidewall angle of the resist pattern after the developing process and a check result of the sidewall angle obtained by a checking apparatus, to set a process condition for the first heat process or the second heat process so as to cause the sidewall angle to approximate the target value thereof after the developing process in a subsequent series of processes.

According to the present invention, there is provided a computer readable storage medium that stores the substrate processing program described above.

According to the present invention, there is provided a substrate processing system, substrate processing method, substrate processing program, and computer readable storage medium storing the program, which allow a desired resist pattern dimension to be attained after a photolithography sequence, so that a uniform resist pattern is formed on the surface of a substrate, independently of the precision level in the light exposure process.

BRIEF DESCRIPTION OF DRAWINGS

FIG. 9 This is a diagram showing an example of a reference table with offset values recorded therein.

BEST MODE FOR CARRYING OUT THE INVENTION

Figure 1:
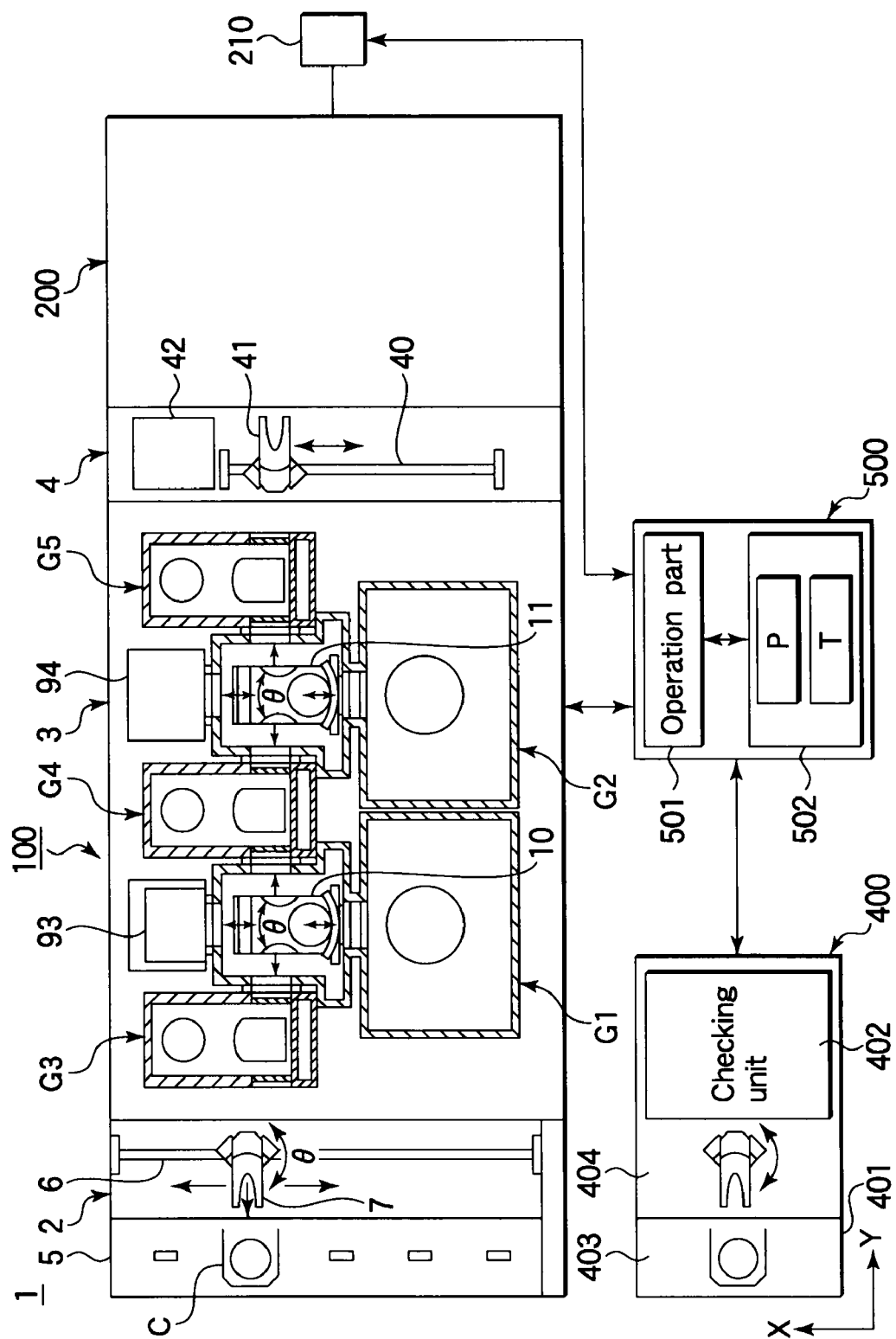
FIG. 1 This is a plan view schematically showing the structure of a pattern forming system, which is a substrate processing system according to the present invention.

A substrate processing system and substrate processing method according to the present invention will now be described with reference to an embodiment shown in the accompanying drawings. FIG. 1 is a plan view schematically showing the structure of a pattern forming system 1, which is a substrate processing system according to the present invention.

The pattern forming system 1 shown in FIG. 1 includes a coating/developing apparatus 100 used for performing resist liquid coating, heating, and developing processes on a target substrate or semiconductor wafer, and a light exposure apparatus 200 for performing a light exposure process on the wafer.

The system further includes a checking apparatus 400 for measuring and checking the line width (CD) and sidewall angle (SWA) of a resist pattern after a photolithography sequence performed by the coating/developing apparatus 100 and light exposure apparatus 200. The respective apparatuses are controlled as a whole by a control section 500 comprising a multi-purpose computer including an operation part (CPU) and a storage part (memory).

Figure 2:
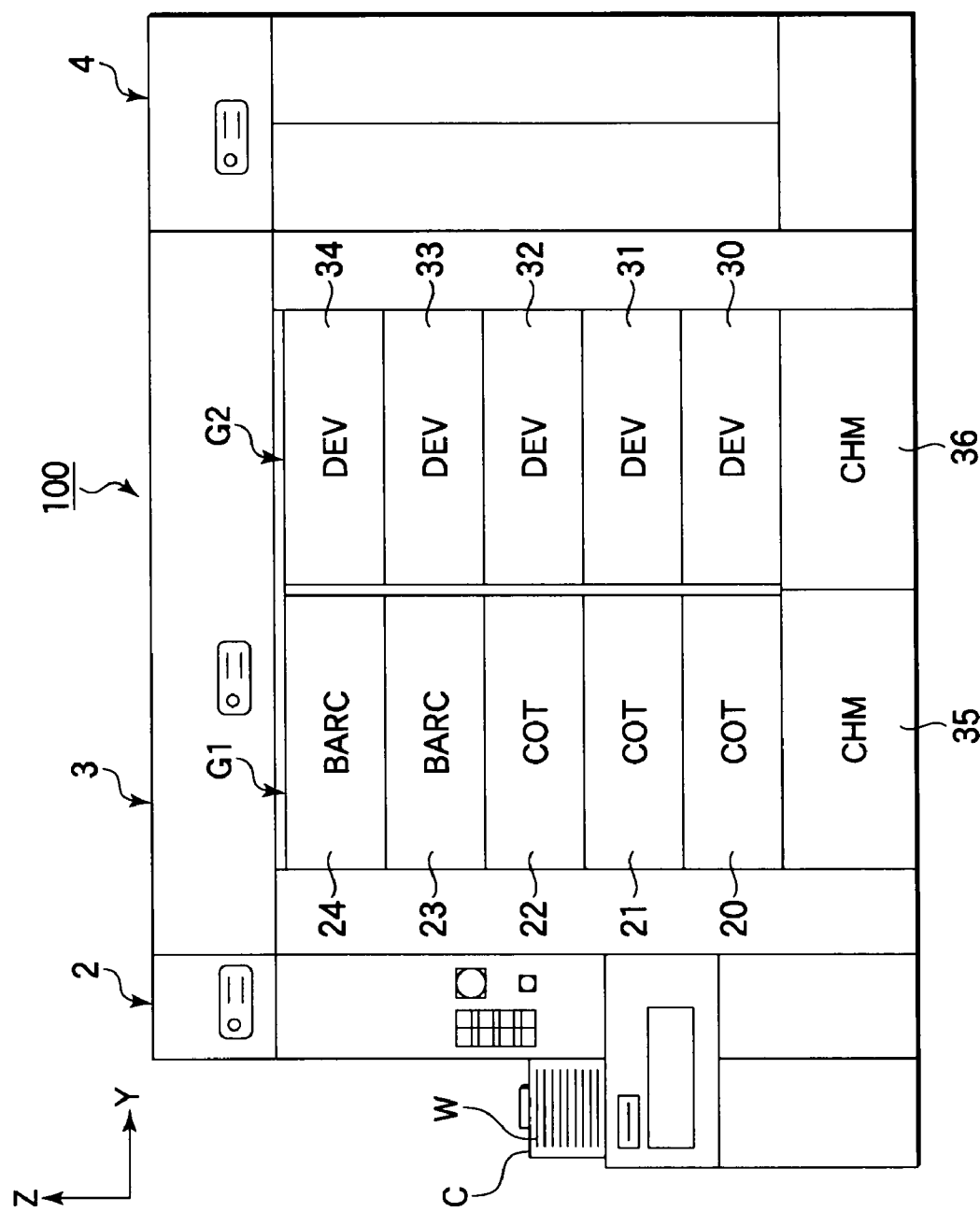
FIG. 2 This is a front view of the coating/developing apparatus shown in FIG. 1.
Figure 3:
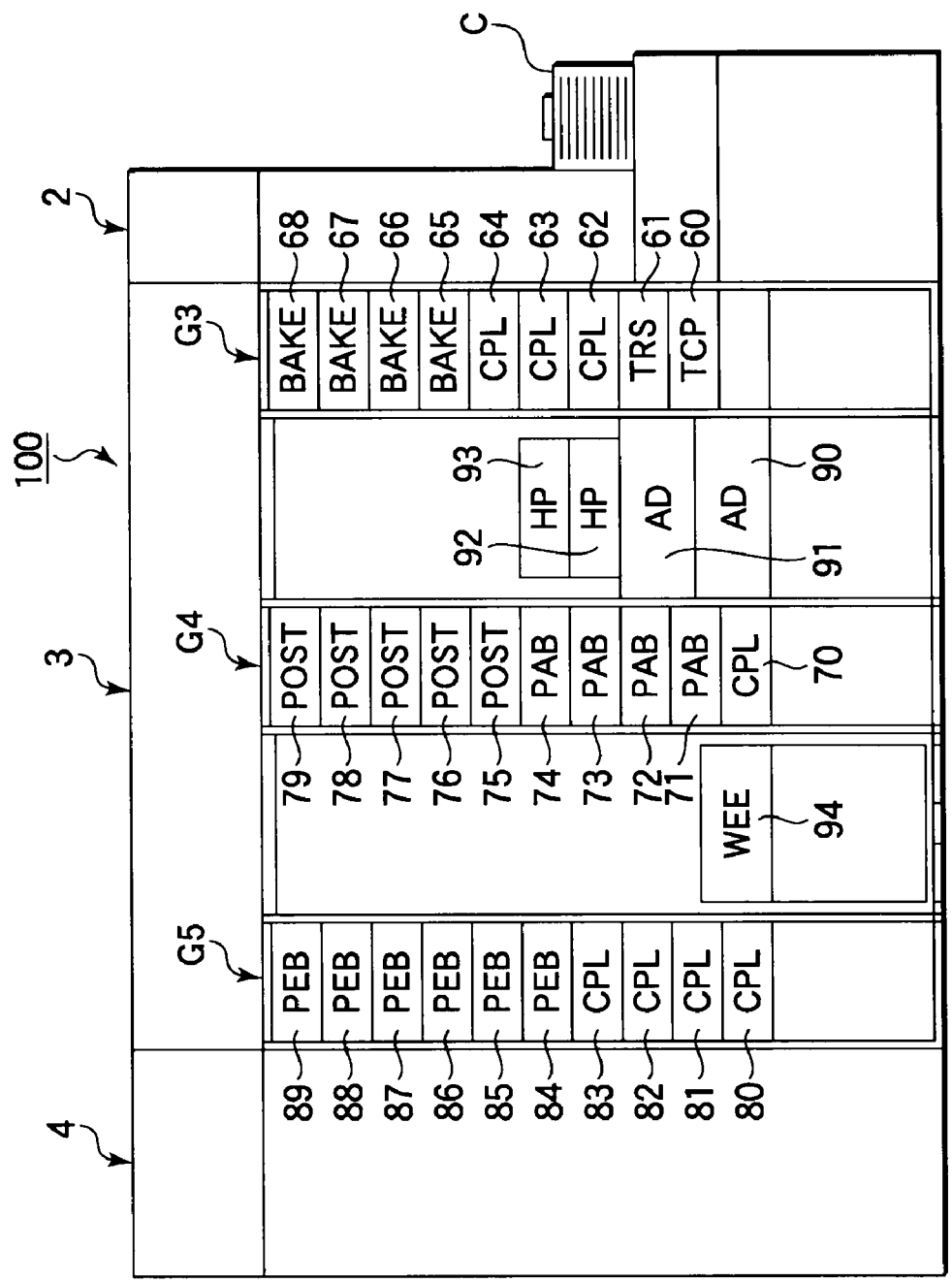
FIG. 3 This is a back view of the coating/developing apparatus shown in FIG. 1.

At first, a brief explanation will be given of the coating/developing apparatus 100 with reference to FIGS. 1 to 3. FIG. 2 is a front view of the coating/developing apparatus 100 shown in FIG. 1. FIG. 3 is a back view of the coating/developing apparatus 100 shown in FIG. 1.

As shown in FIG. 1, the coating/developing apparatus 100 includes a cassette station 2, a process station 3, and an interface section 4 integratedly connected to each other. The cassette station 2 is used such that wafer cassettes, each storing, e.g., 25 wafers W, are transferred to and from external systems therethrough, and wafers W are transferred to and from cassettes C placed thereon. The process station 3 comprises a plurality of processing units stacked one on the other and configured to perform predetermined processes on wafers one by one in a photolithography sequence. The interface section 4 is disposed adjacent to the process station 3 and configured to transfer wafers W to and from the light exposure apparatus 200.

The cassette station 2 includes a cassette table 5, on which a plurality of cassettes C can be placed in a row in an X-direction (the vertical direction in FIG. 1). The cassette station 2 is provided with a wafer transfer member 7 movable on a guide rail 6 in the X-direction. The wafer transfer member 7 is also movable in the array direction of wafers W stored in each cassette C (Z-direction or vertical direction), so that it can selectively access the wafers W in the cassettes arrayed in the X-direction.

Further, the wafer transfer member 7 is rotatable in a Θ-direction about the Z axis, so that it can access a temperature adjusting unit 60 and a transit unit 61 disposed in a third processing unit group G3 inside the process station 3, as described later.

The process station 3 adjacent to the cassette station 2 includes, e.g., five processing unit groups G1 to G5 each comprising a plurality of processing units stacked one on the other.

Specifically, as shown on the lower side of FIG. 1, the process station 3 includes a first processing unit group G1 and a second processing unit group G2 arrayed in this order from the cassette station 2. Further, as shown on the upper side of FIG. 1, the process station 3 includes a third processing unit group G3, a fourth processing unit group G4, and a fifth processing unit group G5 arrayed in this order from the cassette station 2.

A first transfer unit 10 is disposed between the third processing unit group G3 and fourth processing unit group G4. The first transfer unit 10 can selectively access the processing units in the first processing unit group G1, third processing unit group G3, and fourth processing unit group G4 to transfer wafers W to and from these units.

A second transfer unit 11 is disposed between the fourth processing unit group G4 and fifth processing unit group G5. The second transfer unit 11 can selectively access the processing units in the second processing unit group G2 and fifth processing unit group G5 to transfer wafers W to and from these units.

As shown in FIG. 2, the first processing unit group $G_1$ includes five liquid processing units stacked one on the other, each for performing a process on a wafer W while supplying a predetermined liquid thereon. These units are formed of, e.g., resist coating units (COT) 20, 21, and 22 each for applying a resist liquid onto a wafer W and bottom coating units (BARC) 23 and 24 each for forming an anti-reflective coating that prevents reflection of light during a light exposure process, which are stacked in this order from below.

The second processing unit group G2 includes five liquid processing units stacked one on the other, which are formed of, e.g., developing units (DEV) 30 to 34 stacked in this order from below, each for performing a developing process on a wafer W while supplying a developing liquid thereon.

Further, chemical chambers (CHM) 35 and 36 are respectively disposed below the first processing unit group G1 and second processing unit group G2 and are used for supplying various process liquids to the liquid processing units located in the processing unit groups G1 and G2.

As shown in FIG. 3, the third processing unit group G3 includes nine processing units stacked one on the other. These units are formed of, e.g., a temperature adjusting unit (TCP) 60, a transit unit (TRS) 61 through which wafers W are transferred, high-precision temperature adjusting units (CPL) 62 to 64 each for adjusting the temperature of a wafer W by temperature control with high precision, and high-temperature heat processing units (BAKE) 65 to 68 each for performing a heat process on a wafer W at a high temperature, which are stacked in this order from below.

The fourth processing unit group G4 includes ten processing units stacked one on the other. These units are formed of, e.g., a high-precision temperature adjusting unit (CPL) 70, pre-baking units (PAB/first heat processing units) 71 to 74 each for performing a heat process (first heat process) on a wafer W after a resist coating process, and post baking units (POST) 75 to 79 each for performing a heat process on a wafer W after a developing process, which are stacked in this order from below.

The fifth processing unit group G5 includes ten heat processing units stacked one on the other, each for performing a heat process on a wafer W. These units are formed of, e.g., high-precision temperature adjusting units (CPL) 80 to 83 and post-exposure-baking units (PEB/second heat processing units) 84 to 89 each for performing a heat process (second heat process) on a wafer W after light exposure, which are stacked in this order from below.

A plurality of, such as four, processing units are disposed on the forward side of the first transfer unit 10 in the X-direction. As shown in FIG. 3, these units are formed of, e.g., adhesion units (AD) 90 and 91 each for performing a hydrophobic process on a wafer W and heating units (HP) 92 and 93 each for heating a wafer W, which are stacked in this order from below.

A periphery light exposure unit (WEE) 94 is disposed on the forward side of the second transfer unit 11 in the X-direction, for performing light exposure selectively only on the edge portion of a wafer W, for example.

Figure 4:
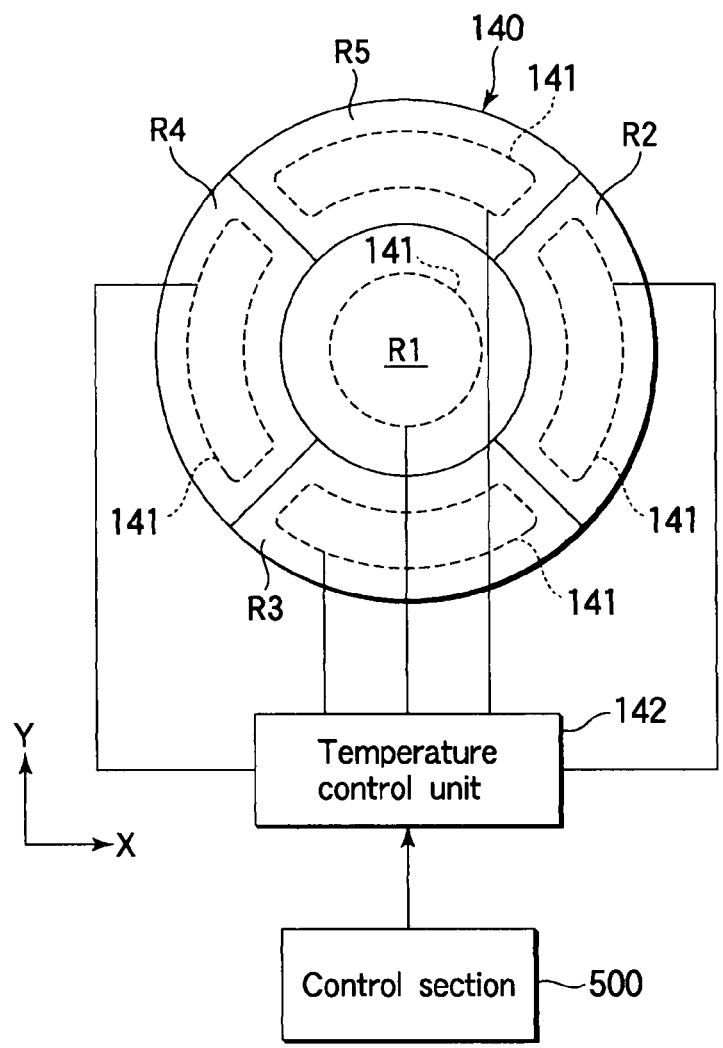
FIG. 4 This is a view schematically showing the structure of the heating plate of a heat processing unit used in the coating/developing apparatus shown in FIG. 1.

Each of the heat processing units, such as the pre-baking units (PAB) 71 to 74 and post-exposure-baking units (PEB) 84 to 89, includes a heating plate 140, as shown in FIG. 4. The heating plate 140 is segmented into a plurality of, such as five, heating areas R1, R2, R3, R4, and R5, as shown in FIG. 4. Specifically, for example, the heating plate 140 is formed of a circular heating area R1 located at the center and four arched heating areas R2 to R5 equally dividing the annular shape around the area R1.

The heating areas R1 to R5 of the heating plate 140 are respectively provided with heating devices or heaters 141 that emit heat by electric supply, so that the heating areas R1 to R5 are independently heated. The heat-emitting amounts of the heaters 141 of the heating areas R1 to R5 are adjusted by a temperature control unit 142 provided to each of the heat processing units. The temperature control unit 142 is configured to adjust the heat-emitting amounts of the heaters 141, so as to control the temperatures of the heating areas R1 to R5 to predetermined temperatures. The temperature setting of the temperature control unit 142 is controlled by the control section 500.

As shown in FIG. 1, the interface section 4 includes a wafer transfer member 41 movable on a guide rail 40 extending in the X-direction, and a buffer cassette 42. The wafer transfer member 41 is movable in the Z-direction and rotatable in a O-direction, so that it can access the light exposure apparatus 200 adjacent to the interface section 4, buffer cassette 42, and fifth processing unit group G5 to transfer wafers W to and from these portions.

The light exposure apparatus 200 is configured to irradiate a wafer W having a resist liquid applied thereon with predetermined light rays from a light exposure section (not shown) through a predetermined mask pattern. The light exposure section includes a light source, a lens, an optical fiber, and so forth.

Light exposure conditions used in the light exposure apparatus 200 are determined by light exposure intensity, light exposure time, light exposure focus (focus), and light exposure alignment position. These parameters are controlled by a controller 210 for controlling the light exposure apparatus 200 as a whole, in accordance with instructions from the control section 500.

Next, an explanation will be given of the flow of a photolithography sequence until a developing process, performed by the coating/developing apparatus 100 and light exposure apparatus 200 having the structures described above.

At first, one of the unprocessed wafers W stored in a cassette C on the cassette station 2 is transferred by the wafer transfer member 7 into the transit unit (TRS) 61 in the third processing unit group G3. After subjected to alignment, the wafer W is transferred into one of the adhesion units (AD) 90 and 91, in which a hydrophobic process is performed on the wafer W. Then, the wafer W is subjected to a predetermined cooling process in one of the high-precision temperature adjusting units (CPL) 62 to 64. Then, the wafer W is transferred into one of the resist coating units (COT) 20 to 22 in the first processing unit group G1, in which a resist coating process is performed on the surface of the wafer W. At this time, transfer of the wafer W from the transit unit 61 to one of the resist coating units (COT) 20 to 22 is performed by the first transfer unit 10.

Then, the wafer W is transferred by the first transfer unit 10 into one of the pre-baking units (PAB) 71 to 74 in the fourth processing unit group G4, in which a predetermined heat process or pre-baking process is performed on the wafer W. After the pre-baking, the wafer W is transferred into the periphery light exposure unit (WEE) 94, in which a light exposure process is performed only on the edge portion of the wafer W.

Thereafter, the wafer W is subjected to a cooling process in one of the high-precision temperature adjusting units (CPL) 80 to 83. Then, the wafer W is temporarily stored into the buffer cassette 42 by the wafer transfer member 41 of the interface section 4.

The wafer W temporarily stored in the buffer cassette 42 is then taken out by the wafer transfer member 41 and transferred to the light exposure apparatus 200, in which a predetermined light exposure process is performed on the wafer W.

After the light exposure process, the wafer W is transferred through the interface section 4 into one of the post-exposure-baking units (PEB) 84 to 89 in the fifth processing unit group G5, in which a post-exposure heat process is performed on the wafer W. Then, the wafer W is transferred by the second transfer unit 11 into one of the developing processing units 30 to 34 in the second processing unit group G2, in which a developing process is performed on the wafer W. Then, the wafer W is transferred into one of the post baking units (POST) 75 to 79 in the fourth processing unit group G4, in which a post-development heat process is performed on the wafer W. Then, the wafer W is subjected to a cooling process in one of the high-precision temperature adjusting units (CPL) 62 to 64 in the third processing unit group G3. Then, the wafer W is transferred by the wafer transfer member 7 back to a cassette C.

Figure 5:
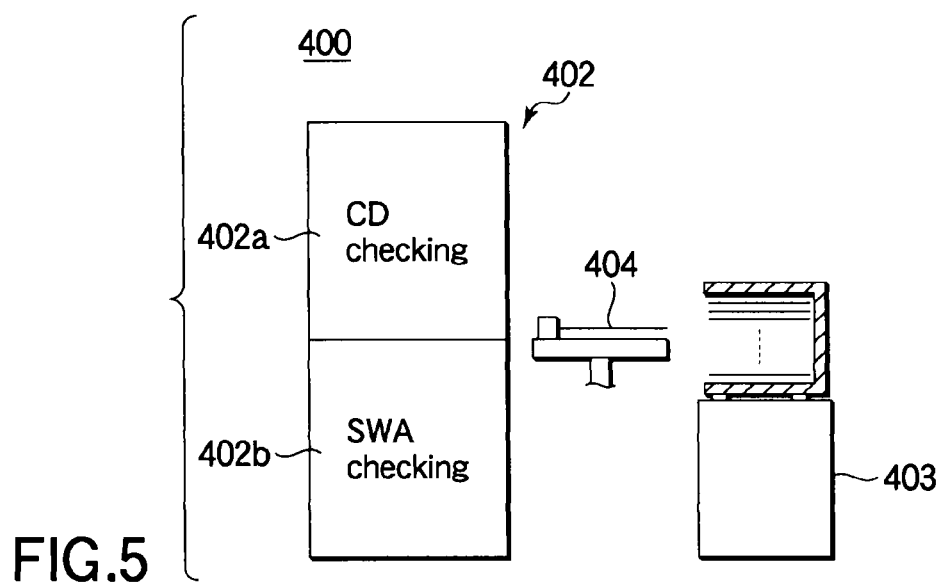
FIG. 5 This is a sectional view schematically showing a checking apparatus used in the pattern forming system shown in FIG. 1.
Figure 6:
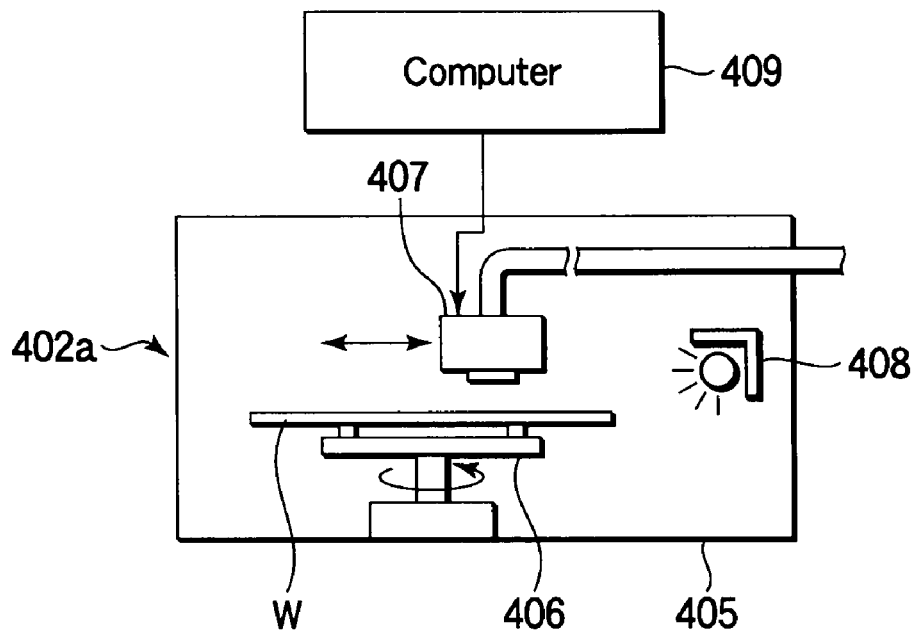
FIG. 6 This is a sectional view showing a main part of a checking machine.

Next, an explanation will be given of the checking apparatus 400, with reference to FIGS. 1, 5, and 6. FIG. 5 is a sectional view schematically showing the checking apparatus. FIG. 6 is a sectional view showing a main part of a checking machine.

For example, as shown in FIG. 1, the checking apparatus 400 includes a casing 401, in which an I/O stage 403, a checking unit 402, and an auxiliary arm 404 are disposed. The I/O stage 403 is used for transferring therethrough a cassette with wafers W stored therein. The auxiliary arm 404 is movable up and down, movable in the X- and Y-directions, and rotatable about a vertical axis, so that it serves as an auxiliary substrate transfer device dedicated to transfer of wafers W between the I/O stage 403 and checking unit 402.

After a wafer W is subjected to the developing process and returned to a cassette C in the coating/developing apparatus 100, the wafer W is transferred by a transfer mechanism (not shown) to the checking apparatus 400, in which the wafer W is checked.

When the wafer W is transferred to the checking apparatus 400, it is stored into the cassette on the I/O stage 403.

For example, in this embodiment, as shown in FIG. 5, the checking unit 402 includes a plurality of, such as two, checking machines, i.e., a CD checking machine 402a and an SWA checking machine 402b. The CD checking machine 402a is configured to measure the line width (CD) of a pattern formed on a wafer W. The SWA checking machine 402b is configured to measure the sidewall angle (SWA) of a pattern.

Each of the CD checking machine 402a and SWA checking machine 402b performs a predetermined check while picking up an image by, e.g., a CCD camera. An example of these machines will be explained with reference to FIG. 6.

For example, each of these checking machines includes a casing 405 having a transfer port (not shown) for a wafer W, in which a rotary table 406, a CCD camera 407, and a lighting device 408 are disposed. The rotary table 406 is configured to support a wafer W in a horizontal state and adjust the orientation thereof. The CCD camera 407 is movable in the X-, Y-, and Z-directions and configured to pick up an image of the wafer W on the rotary table 406. An image of the wafer W picked up by the CCD camera 407 is analyzed and checked by a computer 409 or the like serving as a data processor.

The computer 409 serves to control traveling of the CCD camera 407 and to transmit measurement data to the control section 500. The CCD camera 407 may be set stationary while the table 406 for a wafer W is movable in the X-, Y-, and Z-directions.

Figure 7:
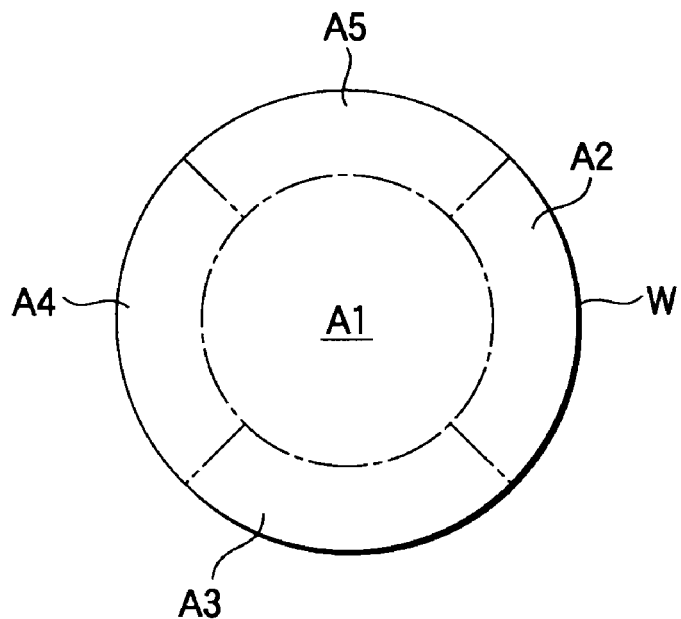
FIG. 7 This is a view showing the areas of a wafer respectively corresponding to the heating areas of the heating plate.
Figure 8:
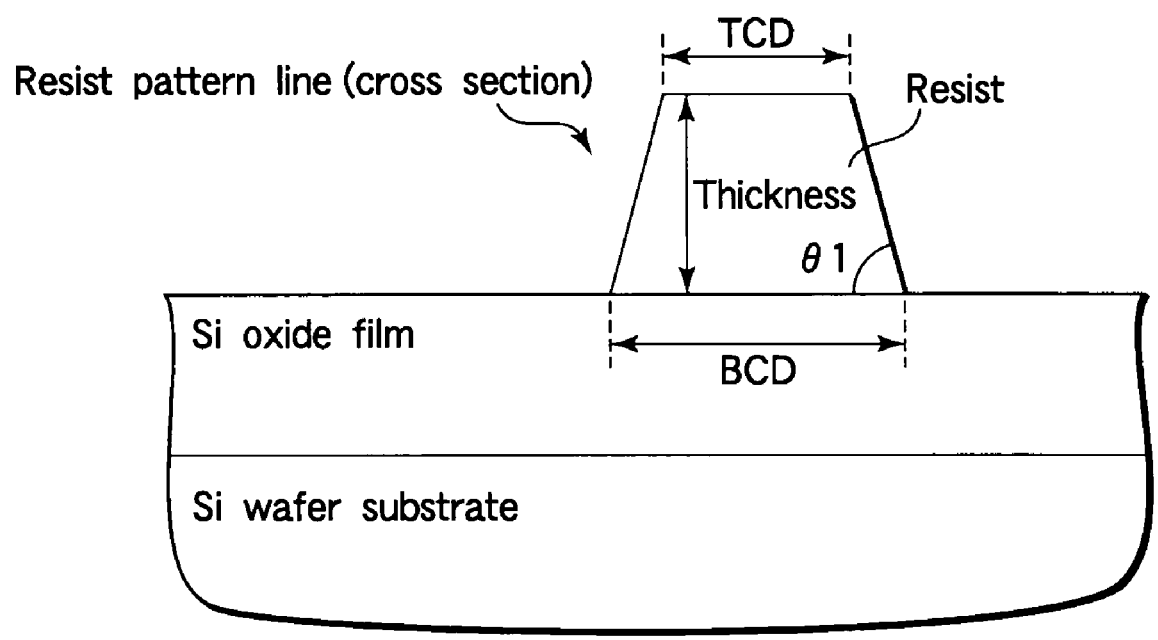
FIG. 8 This is a view for explaining a formula for calculating the sidewall angle.

In the CD checking machine 402a according to the structure described above, a wafer W is checked for each of predetermined areas (substrate areas) A1 to A5 thereof, as shown in FIG. 7, for example. Based on picked-up images of these areas, the computer 409 calculates values of the TCD (top critical dimension), BCD (bottom critical dimension), and pattern thickness of lines of a pattern formed by a photolithography sequence, as shown in the sectional view of FIG. 8, and then transmits the results to the control section 500.

The areas A1 to A5 of the wafer W shown in FIG. 7 respectively correspond to the heating areas R1 to R5 of the heating plate 140 shown in FIG. 4, disposed in each of the pre-baking units (PAB) 71 to 74 and post-exposure-baking units (PEB) 84 to 89.

In the SWA checking machine 402b, based on values of the TCD, BCD, and pattern thickness obtained by the CD checking machine 402a, the computer 409 calculates the sidewall angle θ1 for each of the areas A1 to A5 of the wafer W shown in FIG. 7, in accordance with Formula 1, and then transmits the results to the control section 500.

$$\text{Tan}\theta 1 = \frac{\text{Pattern thickness}}{1/2 \times (BCD - TCD)} \quad \text{(Formula 1)}$$

As shown in FIG. 1, the control section 500 comprises an operation part 501 for executing programs and performing various calculations, and a storage device 502. The storage device 502 stores a program P for performing a pattern forming process including a flow of a photolithography sequence, a reference table T described later, and a plurality of process recipe data with process conditions set therein.

In the control section 500, the storage device 502 storing the program P may comprise a storage medium, such as a hard disk, nonvolatile memory, and/or detachable storage medium (for example, an optical disk or memory card).

After the control section 500 receives measurement results from the checking unit 402, the control section 500 obtains the differences ΔCD and ΔSWA respectively between the pattern line width (CD) and sidewall angle (SWA) thus measured and the target pattern line width (target CD) and target sidewall angle (target SWA) after the photolithography sequence, for each of the areas A1 to A5 of the wafer W. Then, the control section 500 obtains correction values, such as temperature offset values, in accordance with the differences ΔCD and ΔSWA.

For the target pattern line width (target CD), and the pattern line width (CD) measured by the checking unit 402 for obtaining the difference ΔCD from the target CD, either one of TCD and BCD can be applied. In this embodiment, however, BCD is used for this purpose.

As a method for obtaining a correction value, such as a temperature offset value, from the differences ΔCD and ΔSWA, the control section 500 utilizes a reference table T stored in the storage device 502, as shown in FIG. 9, for example.

The reference table T includes correction values (offset values) for heat process conditions, such as temperature offset values, optimum to the differences ΔCD and ΔSWA, which are set in advance respectively for the heating areas R1 to R5 in each of the pre-baking units (PAB) 71 to 74 and post-exposure-baking units (PEB) 84 to 89.

The heat process conditions described above include at least a heat process temperature, a heat process time, and a temperature increase/decrease value.

Where these offset values are applied, a resist pattern is formed with dimensions approximating the target pattern line width (CD) and target sidewall angle (SWA) in each of the areas A1 to A5 of the wafer W after the photolithography sequence.

The reference table T is prepared for each process recipe defined by a combination of the type of a resist liquid, a heat process temperature, and so forth.

Where correction values (offset values), such as temperature offset values, based on ΔCD described above are applied to the pre-baking units (PAB) 71 to 74, correction values (offset values), such as temperature offset values, based on ΔSWA described above are applied to the post-exposure-baking units (PEB) 84 to 89.

Alternatively, where correction values (offset values), such as temperature offset values, based on ΔCD described above are applied to the post-exposure-baking units (PEB) 84 to 89, correction values (offset values), such as temperature offset values, based on ΔSWA described above are applied to the pre-baking units (PAB) 71 to 74.

With the operation described above, optimum offset (correction) values can be set to cause the line width (CD) and sidewall angle (SWA) of a resist pattern after the photolithography sequence to respectively approximate the target values.

Figure 10:
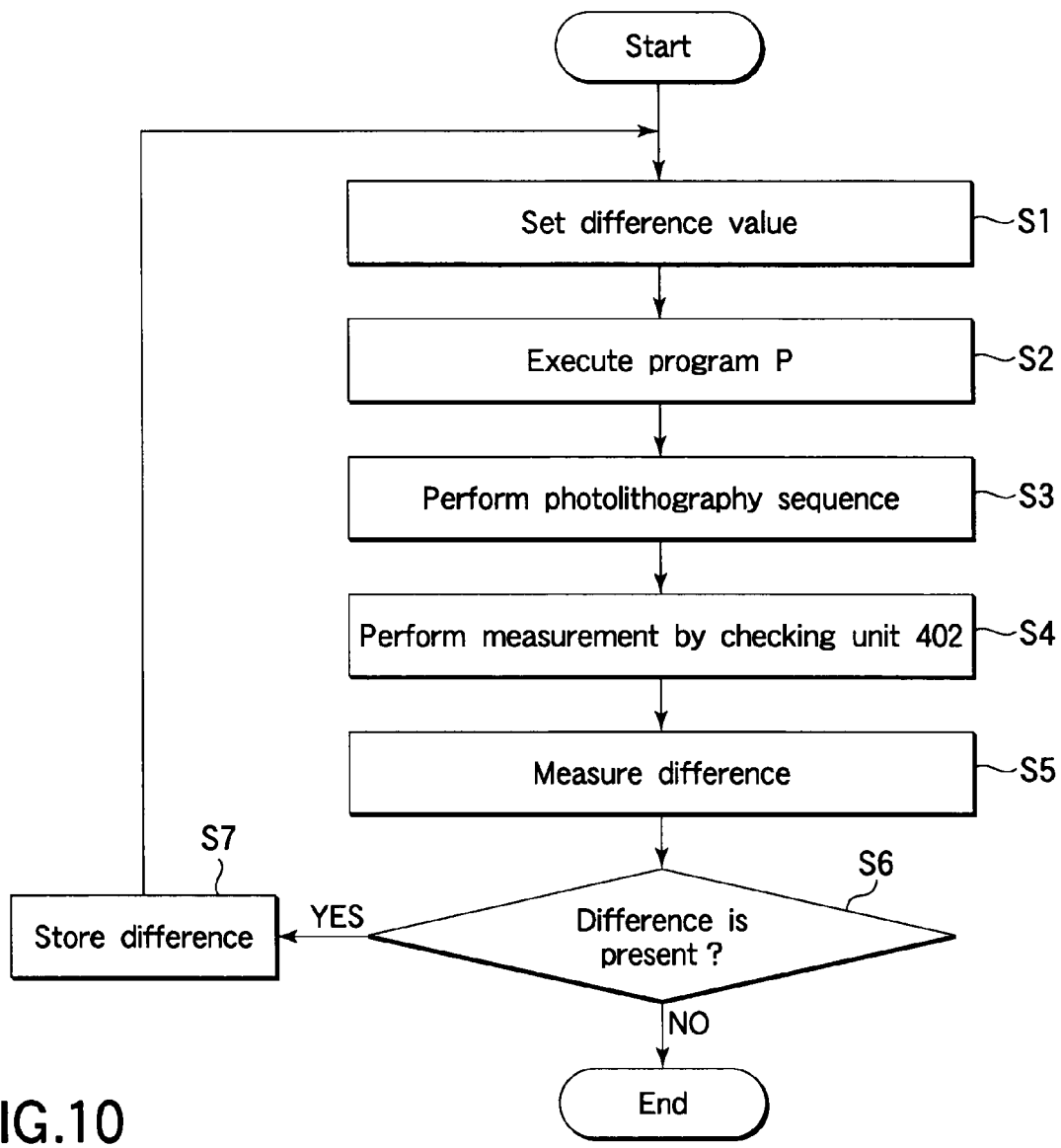
FIG. 10 This is a flow chart showing a flow of control for correcting heat process conditions used in the pattern forming system.
Figure 11:
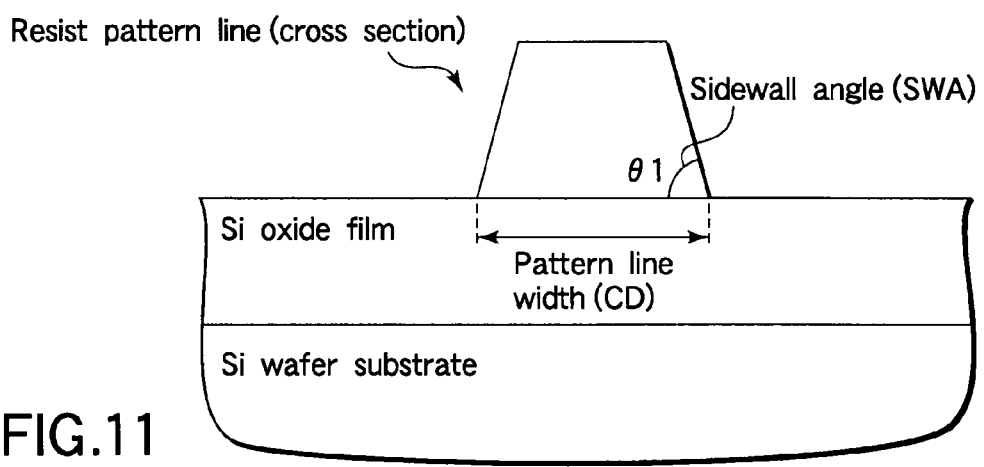
FIG. 11 This is a view for explaining the sidewall angle.

Next, an explanation will be given of a flow of control for correcting heat process conditions used in the pattern forming system 1 having the structure described above, with reference to the flow chart of FIG. 10.

Where difference values ΔCD and ΔSWA are stored in the storage device 502 for each of the areas A1 to A5 of the wafer W in the last pattern forming process, they are set as parameters for the program P (step S1 in FIG. 10).

Then, the program P is executed (step S2 in FIG. 10). Then, a photolithography sequence is performed by the coating/developing apparatus 100 and light exposure apparatus 200 (step S3 in FIG. 10). At this time, according to the program P, correction values, such as temperature offset values, are obtained from a reference table T, in accordance with a plurality of values of ΔCD and ΔSWA set as parameters in the photolithography sequence. These correction values are set as offset values in each of the pre-baking units (PAB) 71 to 74 and post-exposure-baking units (PEB) 84 to 89. Consequently, it is possible to form a resist pattern with a line width (CD) and a sidewall angle (SWA) approximating the target values and essentially uniform over the areas A1 to A5 of the wafer W after the photolithography sequence.

After a predetermined resist pattern is formed on the wafer W, the line width (CD) and sidewall angle (SWA) of the resist pattern are measured by the checking unit 402 for the areas A1 to A5 of the wafer W, and are output to the control section 500 (step S4 in FIG. 10).

When the control section 500 receives measurement results, the control section 500 obtains the difference between each of the measurement results and the corresponding target value (step S5 in FIG. 10), and makes a judgment of whether or not a difference is present (step S6 in FIG. 10). Then, where a difference is present (Yes), this difference ΔCD (and/or ΔSWA) is stored in the storage device 502 as a parameter to be used in the next time (step S7 in FIG. 10). On the other hand, where no difference is present in the step S6 (No), the process for this wafer W is completed.

As described above, according to the embodiment of the present invention, the line width (CD) and sidewall angle (SWA) of a pattern are measured for each of a plurality of areas of a wafer W after a photolithography sequence. Then, offset values used for the heat processing unit are obtained to cause these dimensions to be uniform among the areas and to approximate respective target values. Then, these offset values are used in the next pattern forming process. Consequently, the line width (CD) and sidewall angle (SWA) of a resist pattern, which are resist profiles, can always become uniform and approximate target values on the surface of the wafer after the photolithography sequence.

Further, according to the embodiment, in order to obtain a desired resist profile, there is no need to use focal correction in the light exposure apparatus 200. Accordingly, the resist profile can be controlled with high precision, independently of the precision level in the light exposure apparatus 200.

The embodiment described above is intended only to clarify the technical content of the present invention, and, therefore, the present invention should not be construed as being limited to the embodiment. Various modifications may be made without departing from the spirit of the present invention or the scope of the appended claims. For example, in the embodiment described above, the heating face of the heating plate 140 is segmented into five areas R1 to R5, and the wafer face (substrate face) is also formed of five areas A1 to A5 corresponding to the five areas R1 to R5. However, this is not limiting, and the number of areas may be more than five, for example.

In the embodiment described above, as shown in FIG. 1, the checking apparatus 400 and control section 500 are disposed independently of the coating/developing apparatus 100. However, this is not limiting, and the checking apparatus 400 and/or control section 500 may be incorporated in the coating/developing apparatus 100, as needed. In this case, the occupancy area (foot print) of the apparatus can be smaller in a clean room.

In the embodiment described above, the target substrate is exemplified by a semiconductor wafer, but the present invention may be applied to a substrate other than the semiconductor wafer, such as an LCD substrate, CD substrate, glass substrate, photo mask, or printed board.

INDUSTRIAL APPLICABILITY

The present invention is applicable to, e.g., a pattern forming system for forming a predetermined pattern on a substrate, such as a semiconductor wafer, by a photolithography technique, and is preferably used in the semiconductor manufacturing field, electronic device manufacturing field, and so forth.

The invention claimed is:

1. A substrate processing system for forming a predetermined resist pattern on a substrate by executing a series of processes, which comprises a coating process for applying a resist liquid onto the substrate, a first heat process for performing a heat process on the substrate after the coating process, a light exposure process for performing light exposure on a resist film in accordance with a predetermined pattern, a second heat process for promoting a chemical reaction in the resist film after the light exposure, and a developing process for developing the resist film after the light exposure, the system comprising:
    a checking apparatus configured to measure and check a sidewall angle of the resist pattern formed on the substrate after the developing process; and
    a control section configured to use a difference between a target value of the sidewall angle of the resist pattern after the developing process and a check result of the sidewall angle obtained by the checking apparatus, to set a process condition for the first heat process or the second heat process so as to cause the sidewall angle to approximate the target value thereof after the developing process.

2. The substrate processing system according to claim 1, wherein
    the checking apparatus is configured to measure and check a line width of the resist pattern formed on the substrate after the developing process; and
    the control section is configured to use a difference between a target value of the line width of the resist pattern after the developing process and a check result of the line width obtained by the checking apparatus, to set a process condition for the second heat process or the first heat process so as to cause the line width to approximate the target value thereof after the developing process.

3. The substrate processing system according to claim 1, wherein the system comprises a first heat processing unit configured to perform the first heat process and a second heat processing unit configured to perform the second heat process,
    each of the first heat processing unit and the second heat processing unit includes a heating plate segmented into a plurality of heating areas and configured to place the substrate on the plurality of heating areas, and heating devices configured to respectively and independently heat the plurality of heating areas, and
    the checking apparatus is configured to measure and check the resist pattern after the developing process, for each of substrate areas of the substrate heat-processed respectively by the plurality of heating areas.

4. The substrate processing system according to claim 3, wherein the control section is configured to set a heat process condition for each of the plurality of heating areas of the heating plate.

5. The substrate processing system according to claim 1, wherein the control section is configured to set a process condition for the first heat process or the second heat process for each process recipe determined by a combination of at least a heat process temperature and a resist liquid type.

6. The substrate processing system according to claim 1, wherein process conditions for the first heat process or the second heat process comprise at least a heat process temperature, a heat process time, and a temperature increase/decrease value.

7. A substrate processing method for forming a predetermined resist pattern on a substrate by executing a series of processes, which comprises a coating process for applying a resist liquid onto the substrate, a first heat process for performing a heat process on the substrate after the coating process, a light exposure process for performing light exposure on a resist film in accordance with a predetermined pattern, a second heat process for promoting a chemical reaction in the resist film after the light exposure, and a developing process for developing the resist film after the light exposure, the method comprising:

measuring and checking a sidewall angle of the resist pattern formed on the substrate after the developing process; and using a difference between a target value of the sidewall angle of the resist pattern after the developing process and a check result of the sidewall angle obtained by a checking apparatus, to set a process condition for the first heat process or the second heat process so as to cause the sidewall angle to approximate the target value thereof after the developing process in a subsequent series of processes.

8. The substrate processing method according to claim 7, wherein the method comprises:

measuring and checking a line width of the resist pattern formed on the substrate after the developing process; and using a difference between a target value of the line width of the resist pattern after the developing process and a check result of the line width obtained by the checking apparatus, to set a process condition for the second heat process or the first heat process so as to cause the line width to approximate the target value thereof after the developing process.

9. The substrate processing method according to claim 7, wherein process conditions for the first heat process or the second heat process comprise at least a heat process temperature, a heat process time, and a temperature increase/decrease value.

10. A substrate processing program for execution on a computer, wherein the control program, when executed, causes the computer to control a substrate processing system to perform a substrate processing method for forming a predetermined resist pattern on a substrate by executing a series of processes, which comprises a coating process for applying a resist liquid onto the substrate, a first heat process for performing a heat process on the substrate after the coating process, a light exposure process for performing light exposure on a resist film in accordance with a predetermined pattern, a second heat process for promoting a chemical reaction in the resist film after the light exposure, and a developing process for developing the resist film after the light exposure, the method comprising:

measuring and checking a sidewall angle of the resist pattern formed on the substrate after the developing process; and using a difference between a target value of the sidewall angle of the resist pattern after the developing process and a check result of the sidewall angle obtained by a checking apparatus, to set a process condition for the first heat process or the second heat process so as to cause the sidewall angle to approximate the target value thereof after the developing process in a subsequent series of processes.

11. A computer readable storage medium that stores the substrate processing program according to claim 10.

\* \* \* \* \*